United States Patent
Sturtevant et al.

(10) Patent No.: US 7,638,245 B2
(45) Date of Patent: Dec. 29, 2009

(54) MASK SET FOR VARIABLE MASK FIELD EXPOSURE

(75) Inventors: David J. Sturtevant, Gresham, OR (US); Duane B. Barber, Camas, WA (US); Ann I. Kang, Portland, OR (US)

(73) Assignee: LSI Corporation, Milpitas, CA (US)

( * ) Notice: Subject to any disclaimer, the term of this patent is extended or adjusted under 35 U.S.C. 154(b) by 0 days.

(21) Appl. No.: 12/167,381

(22) Filed: Jul. 3, 2008

(65) Prior Publication Data

US 2008/0274417 A1 Nov. 6, 2008

Related U.S. Application Data

(62) Division of application No. 11/314,649, filed on Dec. 21, 2005, now abandoned, which is a division of application No. 10/429,376, filed on May 5, 2003, now Pat. No. 7,018,753.

(51) Int. Cl.
*G03F 1/00* (2006.01)
*G03F 1/14* (2006.01)

(52) U.S. Cl. .......................................... 430/5

(58) Field of Classification Search ..................... 430/5
See application file for complete search history.

(56) References Cited

U.S. PATENT DOCUMENTS

| | | | | | |
|---|---|---|---|---|---|
| 5,175,128 | A | * | 12/1992 | Ema et al. | 430/312 |
| 5,663,017 | A | * | 9/1997 | Schinella et al. | 430/5 |
| 5,885,749 | A | * | 3/1999 | Huggins et al. | 430/394 |
| 6,136,517 | A | * | 10/2000 | Fletcher | 430/394 |

\* cited by examiner

*Primary Examiner*—Mark F Huff
*Assistant Examiner*—John Ruggles
(74) *Attorney, Agent, or Firm*—Luedeka, Neely & Graham, P.C.

(57) ABSTRACT

A method of fabricating integrated circuits according to a first design. One first pattern is common with a second design, and one second pattern is unique to the first design. The first pattern is imaged using a first mask having first patterns formed in a block thereon. No other patterns of the first and second designs are formed on the first mask. The second patterns are imaged on the substrate using a second mask having second patterns formed in a block thereon. At least one third layer pattern is formed on the second mask.

5 Claims, 1 Drawing Sheet

MASK SET FOR VARIABLE MASK FIELD EXPOSURE

FIELD

This application is a divisional application of prior pending application Ser. No. 11/314,649 filed Dec. 21, 2005 now abandoned which was a divisional application of patent application Ser. No. 10/429,376 filed May. 5, 2003 now U.S. Pat. No. 7,018,753, which issued on Mar. 28, 2006. This invention relates to the field of integrated circuit fabrication. More particularly, this invention relates to reducing the costs and increasing the efficiencies of the photolithographic processes used during integrated circuit fabrication.

BACKGROUND

Integrated circuits are formed of a variety of different layers that are built up, one upon another, where each layer is patterned so as to construct structures that perform a variety of different functions. Typically, integrated circuits have been extremely customized. By this it is meant that a given integrated circuit design, even though it may use transistors, resistors, capacitors and other structures that are common with other designs, tends to have those structures disposed in unique locations and as parts of uniquely designed circuits. Thus, the mask sets for an integrated circuit design have typically been usable only for a single integrated circuit design, with different designs requiring entirely separate mask sets.

Masks have typically been fabricated according to one of two different designs. In a first mask design, the mask contains the image patterns required for a single given pattern layer of a single given integrated circuit design. Typically, the image patterns on the mask cover as much of the surface of the mask as is practical. The benefit of this mask design is that the image patterns on the mask tend to cover a large portion of, or even all of, the surface area of a substrate to be patterned with the mask. This is typically referred to as a wide field exposure mode, because the aperture of the exposure tool is opened wide to expose all of the images on the mask. Thus, this mask design provides for a relatively high throughput of substrates through the imaging process that employs such a mask. However, mask costs tend to be quite high when using this type of mask, because a separate mask is required for each masking layer of each integrated circuit design.

In the second mask design, the mask contains different blocks of image patterns required for several given pattern layers of a single given integrated circuit design. Typically, the blocks of image patterns on the mask are limited in size, so that more blocks can be fit onto the surface of the mask. The benefit of this mask design is that mask costs are reduced, because fewer masks are required to complete the integrated circuit design. This is because the image patterns for several different layers of the integrated circuit design can be placed onto a single mask. Thus, this mask design provides for reduced mask cost. This is typically referred to as a narrow field exposure mode, because the aperture of the exposure tool is restricted so as to only expose the desired portion of the images on the mask. However, throughput of the substrates through the imaging process tends to be quite low when such a mask is utilized, because the smaller block of image patterns for a given layer must be exposed and repeated multiple times across the surface of the substrate in order to completely image the substrate with the block of patterns.

What is needed, therefore, is a system whereby the strengths of various mask designs can be combined to both increase the efficiency of the exposure process and decrease the costs associated with masks.

SUMMARY

The above and other needs are met by an improvement to a method of fabricating a plurality of integrated circuits on a substrate according to a first integrated circuit design. Each of the integrated circuits is formed with a plurality of layer patterns. At least one first layer pattern of the layer patterns is common with a second integrated circuit design, and at least one second layer pattern of the layer patterns is unique to the first integrated circuit design. The first layer pattern is imaged on the substrate using an exposure tool and a first mask having a first number of the first layer patterns formed in a block thereon. No other layer patterns of the first layer patterns and the second layer patterns are formed on the first mask. The first number is less than the plurality of integrated circuits formed on the substrate. The first layer patterns are imaged on the substrate by stepping and repeating the block of first number of first layer patterns across the substrate with the exposure tool. The first layer patterns on the first mask are formed at a size that is larger than a size at which the first layer patterns are imaged on the substrate.

The second layer patterns are imaged on the substrate using an exposure tool and a second mask having a second number of the second layer patterns formed in a block thereon. At least one additional layer pattern of the second layer patterns is formed on the second mask. The second number is less than the plurality of integrated circuits formed on the substrate. The second layer patterns are imaged on the substrate by exposing and repeating the block of second number of second layer patterns across the substrate with the exposure tool. The second layer patterns on the second mask are formed at a size that is larger than a size at which the second layer patterns are imaged on the substrate.

In this manner, a single block of a layer pattern that is common across many different integrated circuit designs can be formed on a single mask, which is then used in the fabrication process for all of the different integrated circuit designs to which it is associated. Thus, separate masks for these common layer patterns are not required, and fewer masks are required. In addition, this block of common layer patterns can be formed using a relatively large number of images, which can be exposed using a relatively wider field in the exposure tool, thus increasing exposure efficiency. However, for layer patterns that are unique to a given integrated circuit design, the block of unique layer patterns can be formed on a separate mask with other unique layer patterns for the same integrated circuit design. Thus, fewer masks are required for the unique layer patterns. By forming these block patterns with a relatively smaller number of images, more and different unique block patterns can fit on a single mask, reducing the overall mask count. These smaller unique block patterns can then be exposed using a relatively narrower field in the exposure tool, so that only the desired unique block pattern on the mask is exposed.

In various preferred embodiments, the first number of first layer patterns is greater than the second number of second layer patterns. The block of first number of first layer patterns is preferably imaged using a wide field mode on the exposure tool, and the block of second number of second layer patterns is imaged using a narrow field mode on the exposure tool. Preferably, the second mask includes separate blocks of all second layer patterns required for the fabrication of the plurality of integrated circuits according to the first integrated circuit design.

According to another aspect of the invention there is described a mask set for a first integrated circuit design. The mask set includes a first mask having only a block of a first number of first layer patterns of the first integrated circuit design, where the first number is less than the plurality of integrated circuits formed on the substrate. The first layer patterns on the first mask are formed at a size that is larger than a size at which the first layer patterns are imaged on a substrate. The first layer patterns are common between the first integrated circuit design and at least one other integrated circuit design.

A second mask has a block of a second number of second layer patterns of the first integrated circuit design, where the second number is less than the plurality of integrated circuits formed on the substrate. The second layer patterns on the second mask are formed at a size that is larger than a size at which the second layer patterns are imaged on the substrate. The second layer patterns are unique to the first integrated circuit design. The second mask also has a block of a third number of third layer patterns of the first integrated circuit design, where the third number is less than the plurality of integrated circuits formed on the substrate. The third layer patterns on the second mask are formed at a size that is larger than a size at which the third layer patterns are imaged on the substrate. The third layer patterns are unique to the first integrated circuit design.

According to yet another aspect of the invention, there is described a method of imaging a family of related integrated circuit designs. The family of related integrated circuit designs includes at least a first layer pattern in common between the family of related integrated circuit designs. Each of the integrated circuit designs within the family of related integrated circuit designs also includes at least a second layer pattern that is unique to a given one of the integrated circuit designs within the family of related integrated circuit designs.

The first layer pattern is imaged on a substrate using an exposure tool and a first mask having a first number of the first layer patterns formed in a block thereon. No other layer patterns of the first layer patterns and the second layer patterns are formed on the first mask. The first number is less than a number of integrated circuits formed on the substrate. The first layer patterns are imaged on the substrate by stepping and repeating the block of first number of first layer patterns across the substrate with the stepper. The first layer patterns on the first mask are formed at a size that is larger than a size at which the first layer patterns are imaged on the substrate The second layer pattern is imaged on the substrate using an exposure tool and a second mask having a second number of the second layer patterns formed in a block thereon. The second number is less than the first number, and at least one additional layer pattern of the second layer patterns is formed on the second mask. The second number is also less than the number of integrated circuits formed on the substrate. The second layer patterns are imaged on the substrate by exposing and repeating the block of second number of second layer patterns across the substrate with the exposure tool. The second layer patterns on the second mask are formed at a size that is larger than a size at which the second layer patterns are imaged on the substrate.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

Figure 1:
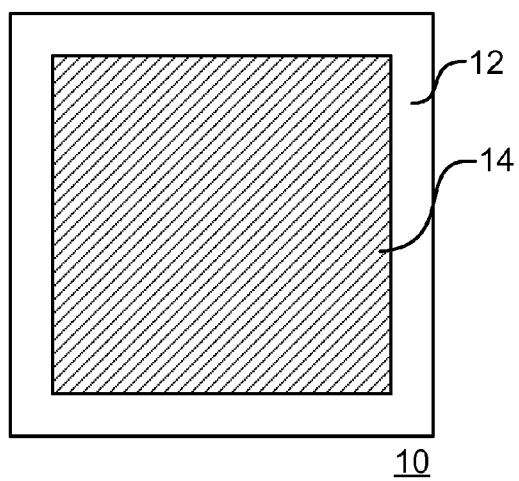
FIG. 1 is a top plan view of a first mask having only a single block of a single layer pattern.

With reference now to FIG. 1, there is depicted a top plan view of a first mask 10 having only a single block 14 of a single layer pattern. The block 14 preferably makes as much use of the surface area of the mask 10, and leaves only a small border 12 unused at the peripheral edges of the mask 10. The block 14 represents multiple instances of an image required to form a single layer of an integrated circuit design. Most preferably, this layer is one that is used by more than one integrated circuit design, and thus the mask 10 can be used as a part of the fabrication process for many different integrated circuit designs.

As depicted in FIG. 1, the block of images 14 is formed to be relatively large, so that the exposure tool, most preferably a stepper or a scanner, can be operated in a wide field or full field mode, and many of the individual images in the block 14 can be projected in a single exposure step cycle. In this manner, the use of the mask 10 is very efficient during the exposure process, because many images are projected onto a substrate in each exposure step cycle. Further, the mask 10 is also relatively economical, because it can be used for a layer pattern that is common to more than one integrated circuit design. Thus, the benefits of both efficiency and economy are realized by use of the mask 10.

Figure 2:
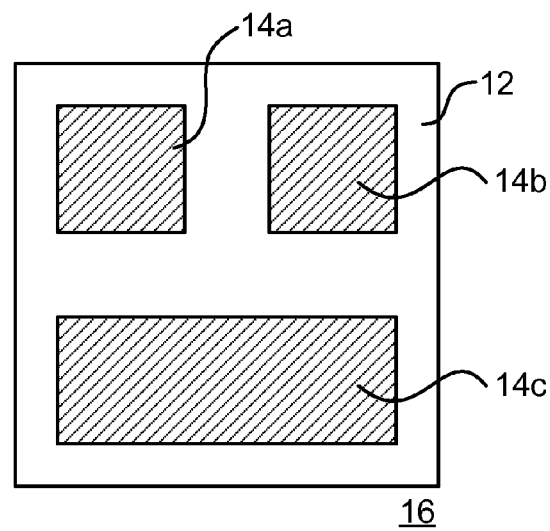
FIG. 2 is a top plan view of a second mask having multiple blocks of different layer patterns.

FIG. 2 is a top plan view of a second mask 16 having multiple blocks 14a, 14b, and 14c of different layer patterns. The image blocks 14a, 14b, and 14c each contain multiple instances of images required for a unique layer pattern within an integrated circuit design. Thus, the images in the blocks 14a, 14b, and 14c are not used in more than one integrated circuit design, but are only used in a single integrated circuit design. However, it is appreciated that one of each of the three blocks 14a, 14b, and 14c may be used in three different integrated circuit designs, or all of the blocks 14a, 14b, and 14c may be different unique layers of the same integrated circuit design. The blocks 14a, 14b, and 14c are each exposed individually, with the exposure field of the exposure tool reduced so as to exclude the other blocks, in a narrow field or small field mode.

Because the size of each of the blocks 14a, 14b, and 14c is relatively small in comparison to the block 14 depicted in FIG. 1, the exposure efficiencies are somewhat lost. However, the economy of only using a single mask for three different image blocks 14a, 14b, and 14c reduces the overall costs. Preferably, there is some balance between the size of each of the blocks 14a, 14b, and 14c and the number of such blocks 14a, 14b, and 14c that are placed on the mask 16.

For example, if the mask cost is relatively high, but the cost of having to make multiple exposures to cover the surface of a substrate with the images in a block of images 14 is relatively low, then preferably the blocks 14 are formed in the mask 16 as small as possible, and as many different blocks 14 as possible are placed on the mask 16, and fewer masks 16 are required. In the limit, just a single device image is placed within each block 14 according to this economy.

However, if the mask cost is relatively low, but the cost of having to make multiple exposures to cover the surface of a substrate with the images in the block of images 14 is relatively high, then preferably the blocks 14 are formed in the mask 16 at least a bit larger, so that fewer exposure steps are required when using one of the blocks 14. In the limit, just two blocks 14 are placed on the mask 16 according to this economy. In actual implementation, the number of blocks 14 and the number of images within each block 14 will preferably be somewhere in between the two limits as described, as the economies or other factors dictate.

Thus, the present invention combines the throughput advantages of full field masks on those layers common to a large number of devices, with the mask cost reduction advantages of small field masks on those layers customized for a smaller number of devices. This invention is a method of implementing such a mixed large field and small field strategy within the lithography area. It addresses both the accommodation of multiple field sizes within a lithography tool job, and also the corresponding requirements imposed on the reticle layouts.

According to the present invention, some layers of an integrated circuit design will be formed using large field images, and other layers of the integrated circuit design will be formed using small field images. Thus, there are some considerations in the layout of the images on the reticles that must be accounted for, so as to ensure proper alignment between integrated circuit layers, and proper formation of elements such as test structures in the scribe lines of the substrate, which typically require the proper alignment of several different layers.

The requirement on reticle layout is fairly straight forward. All large field images are preferably formed of an integral number of small images packed together. The smallest image preferably acts as a building block, from which any and all larger images are constructed. For larger images, this may result in redundant test features within scribe lines, since these features are preferably repeated for every small image building block. However, since test features are often constructed with multiple processing layers, this technique is preferred to insure that any combination of large field and small field masks for various layers still results in the complete construction of all desired test features. This building block methodology helps ensure that all test features are fully formed, regardless of mask strategy.

Within the job of the lithographic exposure tool, which in this case is a stepper or a scanner, the basic cell or field structure—meaning the grid the tool uses to determine the locations at which to expose an image—is preferably set up to match the dimensions of the smallest of the field sizes being used. In addition, substrate layout—meaning the placement of this grid onto a substrate, which preferably determines how many intact dice end up on the substrate—is preferably optimized with respect to this smallest field size.

Figure 3:
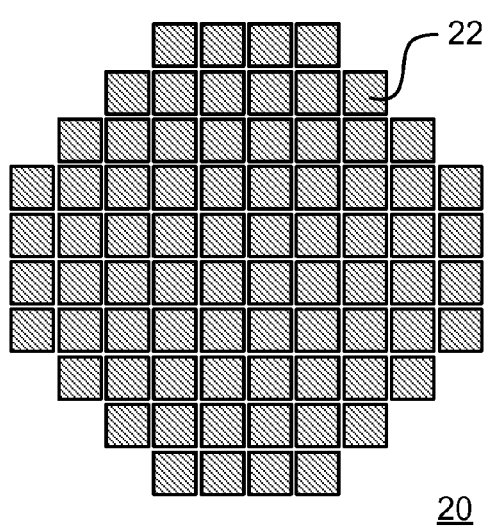
FIG. 3 depicts an exposure pattern on a substrate for a smallest unique layer pattern.

Once the cell grid has been defined, the images to be exposed are defined. One image is preferably defined for the smallest field size used. The dimensional information for this image preferably matches the dimensions of the cell grid, since the cell grid is preferably set up based on the smallest field size used. This is depicted in FIG. 3, where each of the image fields 22 is exposed. Next, additional images are preferably defined for any and all larger field sizes used. It is anticipated that there will typically be only two distinct field sizes—small and large. However, there is nothing that prevents the use of three or more different field sizes, so long as all the sizes satisfy the constraints on mask layout, which are described hereafter. The dimensional information for a larger field size preferably corresponds to the dimensions of the pattern on the full field or large field mask.

Figure 4:
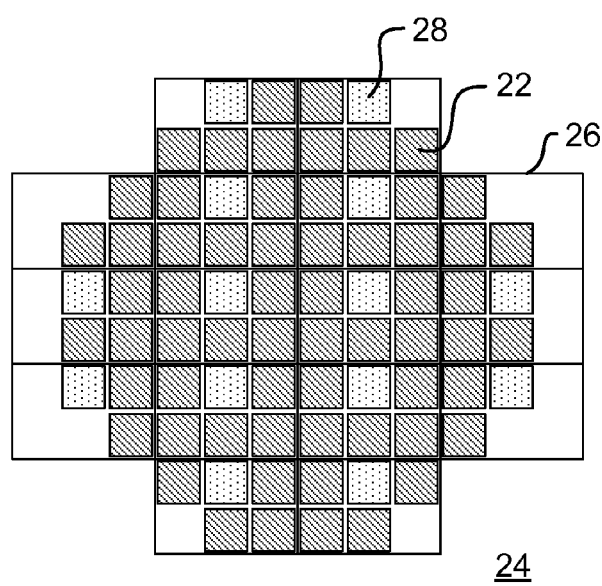
FIG. 4 depicts an exposure pattern on a substrate for a larger multiple of the smallest unique layer pattern.

The next step in setting up the job is to distribute the images, as defined above, with respect to the cell grid. The smallest image defined above is preferably distributed to all cells on the substrate, as depicted in FIG. 3. In other words, the smallest image is preferably exposed in every cell of the cell grid. Larger images are preferably distributed to only some of the cells in the cell grid, as depicted in FIG. 4. The cells 28 to which these larger images 26 are distributed are preferably chosen such that, after factoring in the actual size of the larger images, exposing these images at each of the selected cells preferably results in complete exposure coverage of the substrate, but no exposures are overlapped one with another. For example, if a large image is two times as tall and three times as wide as the smallest image used, as depicted in FIG. 4, then the larger image is preferably distributed to only one out of the six cells in the cell grid.

Another consideration in setting up the exposure job is insuring that the larger images preferably fall directly on top of the smallest image. If a larger image is an odd numbered multiple of the smallest image in both X and Y axes, as in a three by three case, then it is relatively straight forward to ensure such proper alignment. The larger image is preferably distributed to the cells corresponding to the center building block within the larger image. However, if the larger image is an even numbered multiple of the smallest image in either axis, as depicted in FIG. 4, then the larger image is preferably shifted one way or another with respect to the cell grid along the even multiple axis. In this case, a shift equal to one half the length of the smallest image along the axis in question results in proper alignment of the larger image to the smallest image.

This methodology, when followed for both mask layout and exposure tool recipe, permits the smooth implementation of a scheme in which different processing layers use different exposure field sizes.

The foregoing descriptions of preferred embodiments for this invention have been presented for purposes of illustration and description. They are not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as is suited to the particular use contemplated. All such modifications and variations are within the scope of the invention as determined by the appended claims when interpreted in accordance with the breadth to which they are fairly, legally, and equitably entitled.

What is claimed is:

1. A mask set for a first integrated circuit design, the mask set comprising:

a first mask having only a block of a first number of first vertical layer patterns of the first integrated circuit design, where the first number is less than a plurality of integrated circuits formed on a substrate, and the first vertical layer patterns on the first mask are formed at a size that is larger than a size at which corresponding first vertical layer patterns are imaged on the substrate, and the first vertical layer patterns are common between the first integrated circuit design and at least one other integrated circuit design, and a second mask having a block of a second number of second vertical layer patterns of the first integrated circuit design, where the second number is less than the plurality of integrated circuits formed on the substrate, and the second vertical layer patterns on the second mask are formed at a size that is larger than a size at which corresponding second vertical layer patterns are imaged on the substrate, and the second vertical layer patterns are unique to the first integrated circuit design, the second mask also having a block of a third number of third vertical layer patterns of the first integrated circuit design, where the third number is less than the plurality of integrated circuits formed on the substrate, and the third vertical layer patterns on the second mask are formed at a size that is larger than a size at which corresponding third vertical layer patterns are imaged on the substrate, and the third vertical layer patterns are unique to the first integrated circuit design.

2. The mask set of claim 1, wherein the first number of first vertical layer patterns is greater than the second number of second vertical layer patterns.

3. The mask set of claim 1, wherein the block of the first number of the first vertical layer patterns is imaged using a wide field mode on an exposure tool.

4. The mask set of claim 1, wherein the block of the second number of the second vertical layer patterns is imaged using a narrow field mode on an exposure tool.

5. The mask set of claim 1, wherein the second mask includes separate blocks of all unique layer patterns required for the first integrated circuit design.

* * * * *